(12) United States Patent
Aichriedler et al.

(10) Patent No.: US 11,901,675 B2
(45) Date of Patent: *Feb. 13, 2024

(54) MAGNETIC CURRENT SENSOR INTEGRATION INTO HIGH CURRENT CONNECTOR DEVICE

(71) Applicant: Infineon Technologies AG, Neubiberg (DE)

(72) Inventors: Leo Aichriedler, Puch (AT); Gaetano Formato, Villach (AT); Dietmar Spitzer, Voelkermarkt (AT); Ramdas Ugale, Pune (IN)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,054

(22) Filed: May 26, 2022

(65) Prior Publication Data
US 2022/0285890 A1  Sep. 8, 2022

Related U.S. Application Data

(63) Continuation of application No. 17/019,860, filed on Sep. 14, 2020, now Pat. No. 11,349,265.

(51) Int. Cl.
*G01R 15/20* (2006.01)
*H01R 13/66* (2006.01)

(52) U.S. Cl.
CPC ....... *H01R 13/6683* (2013.01); *G01R 15/202* (2013.01); *G01R 15/205* (2013.01); *G01R 15/207* (2013.01)

(58) Field of Classification Search
None
See application file for complete search history.

(56) References Cited

U.S. PATENT DOCUMENTS

| | | | |
|---|---|---|---|
| 6,642,704 | B2 | 11/2003 | Hastings et al. |
| 7,068,039 | B2 | 6/2006 | Parker |
| 8,917,085 | B2 | 12/2014 | Hashio et al. |
| 8,947,083 | B2 | 2/2015 | Nakajima et al. |

(Continued)

FOREIGN PATENT DOCUMENTS

| | | | |
|---|---|---|---|
| CN | 1409120 A | 4/2003 | |
| CN | 1690722 A | 11/2005 | |

(Continued)

*Primary Examiner* — Jas A Sanghera
(74) *Attorney, Agent, or Firm* — Harrity & Harrity, LLP (57) ABSTRACT

A power connector is provided that is configured to conduct a current and includes a conductive frame including a base structure, an extension structure, and a cap structure that define a current path for the current. The base structure is configured to be coupled to a current supply for receiving the current therefrom. The cap structure is configured to be coupled to an electrical interface of a device to be supplied with the current and outputs the current from the connector to the electrical interface of the device. The extension structure is coupled to and vertically extends between the base structure and the cap structure. The extension structure includes a current constriction region that is configured to cause a defined magnetic field of the current flowing through the current constriction region at a predefined position.

20 Claims, 7 Drawing Sheets

(56) References Cited

U.S. PATENT DOCUMENTS

| | | | |
|---|---|---|---|
| 9,310,398 B2 | 4/2016 | Ausserlechner | |
| 10,248,147 B2 | 4/2019 | Wagner et al. | |
| 11,255,884 B2 | 2/2022 | Esaka et al. | |
| 11,349,265 B2 * | 5/2022 | Aichriedler | H01R 13/6683 |
| 2002/0190703 A1 | 12/2002 | Goto et al. | |
| 2011/0012590 A1 * | 1/2011 | Kuroki | G01R 15/207 |
| | | | 324/142 |
| 2013/0119975 A1 | 5/2013 | Nakajima et al. | |
| 2013/0257469 A1 | 10/2013 | Arima | |
| 2017/0023633 A1 | 1/2017 | Song | |
| 2018/0342841 A1 | 11/2018 | Fukuhara et al. | |
| 2019/0229640 A1 | 7/2019 | Aichriedler et al. | |

FOREIGN PATENT DOCUMENTS

| | | |
|---|---|---|
| CN | 101952732 A | 1/2011 |
| CN | 103134974 A | 6/2013 |
| CN | 106953528 A | 7/2017 |
| CN | 108120865 A | 6/2018 |
| CN | 110071645 A | 7/2019 |
| GB | 2533570 A | 6/2016 |
| JP | 2009156802 A | 7/2009 |
| WO | 2017083385 A1 | 5/2017 |
| WO | 2019181171 A1 | 9/2019 |

\* cited by examiner

MAGNETIC CURRENT SENSOR INTEGRATION INTO HIGH CURRENT CONNECTOR DEVICE

CROSS-REFERENCE TO RELATED APPLICATIONS

This application is a continuation of U.S. patent application Ser. No. 17/019,860 filed Sep. 14, 2020, which is incorporated by reference as if fully set forth.

BACKGROUND

For high current applications and/or applications requiring galvanic isolation between the conductor carrying the test current and the current sensor output, magnetic current sensors are used. For example, magnetic current sensors may be used to determine the phase currents delivered by an inverter power module to an electric motor, or to determine other load currents provided by power distribution systems, electronic fuses, battery monitoring systems, battery disconnect switches, and the like.

These devices sense the test current indirectly by measuring the magnetic flux density created by the test current. Traditional implementations of magnetic current sensors utilize a ferrous core (field concentrator) that is to some degree wrapped around the conductor carrying the test current. The flux density in the field concentrator is proportional to the test current following $Br=\mu 0*ur*Itest$. The relative permeability $\mu r$ of the iron core therefore performs an amplification of the flux density. A linear field probe (e.g. a linear hall sensor) measures the flux produced by the test current and therefore provides a galvanically isolated output signal representing the test current. Other implementations of core-based sensors compensate the flux density produced by the test current via a compensation winding. In this case, the field probe is required to control the resulting flux density to a constant value (e.g. zero), while the compensation current is proportional to the test current.

However, using a core-based magnetic sensor has a number of disadvantages, including cost, complex assembly strategy, inefficiencies in power dissipation, inaccuracies resulting from hysteresis effects and non-linearity of the field concentrator, and saturation effects, overload capability (remanence), weight, and size. For example, to assemble, each current rail of a power module needs to be routed through a field concentrator associated with each magnetic sensor. This adds complexity and bulk to the assembly of the power module.

Coreless current sensors operate without the use of field concentrators. Different to core-based implementations, these sensors directly measure the flux density produced by the test current. By avoiding an iron-core, the drawbacks listed above with respect to core-based magnetic sensors can be omitted. However, the available flux density at the sensitive elements is significantly reduced. Therefore, the sensitive elements need to be placed as close as possible to the conductor. Since current sensors are typically operated in an electromagnetic interference (EMI)-polluted environment (power electronics) it is highly beneficial to implement a differential sensing concept providing intrinsic stray field immunity against distorting fields produced by adjacent elements (semiconductors, capacitors, inductors, conductors).

However, differential sensing is a critical bottleneck in the design of coreless current sensors and different power applications may impose different design constraints on implementing differential sensing. Routing the test current past a differential field sensor also becomes an issue as it is difficult to implement without increasing the size of the device. As a result, manufacturing costs increase in order to accommodate different design and sensing principles. In other words, there is no universal differential sensing solution.

Therefore, an improved device that provides coreless differential current sensing may be desirable.

SUMMARY

Embodiments provide a power connector configured to conduct a current of a power device and deliver the current to a load. The power connector includes a conductive frame including a base structure, an extension structure, and a cap structure that define a connector volume. The base structure is coupled to an output node of at least one primary conductor of the power device, wherein the base structure is configured to receive the current from the at least one primary conductor. The cap structure is arranged relative to the base structure, wherein the cap structure is configured to mechanically couple the power connector to the load, and wherein the cap structure is configured to receive the current from the base structure and output the current from the power connector to the load. The extension structure is coupled to and extends between the base structure and the cap structure, wherein the extension structure receives the current from the base structure and delivers the current to the cap structure. The extension structure includes a current constriction region that is configured to cause a defined magnetic field of the current flowing through the current constriction region at a position of a magnetic current sensor. The power connector further includes the magnetic current sensor is configured to generate a sensor signal based on the defined magnetic field produced by the current flowing through the current constriction region.

Embodiments provide an output stage of a power device. The output stage includes a power circuit configured to generate a current; at least one primary conductor coupled to an output of the power circuit, wherein the at least one primary conductor includes an output node and the least one primary conductor is configured to conduct the current from the power circuit to the output node; and a power connector coupled to the output node and configured to transmit the current from the at least one primary conductor to a load. The power connector includes: a conductive frame including a base structure, an extension structure, and a cap structure that define a connector volume; wherein the base structure is coupled to an output node of at least one primary conductor of the power device, wherein the base structure is configured to receive the current from the at least one primary conductor, wherein the cap structure is arranged relative to the base structure, wherein the cap structure is configured to mechanically couple the power connector to the load, and wherein the cap structure is configured to receive the current from the base structure and output the current from the power connector to the load, wherein the extension structure is coupled to and extends between the base structure and the cap structure, wherein the extension structure receives the current from the base structure and delivers the current to the cap structure, wherein the extension structure includes a current constriction region that is configured to cause a defined magnetic field of the current flowing through the current constriction region at a position of a magnetic current sensor. The power connector further includes the magnetic current sensor is configured to generate a sensor signal based on the defined magnetic field produced by the current flowing through the current constriction region.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Embodiments described herein further relate to differential magnetic field sensors (i.e., differential sensor modules), each of which includes a pair of sensor elements that are configured to generate sensor signals that are to be combined to generate a differential sensor signal, to be described below. The sensor elements may be any type of magnetic field sensor element, including Hall effect sensor elements and magnetoresistive sensor elements. Each sensor element has a plane of sensitivity that may be referred to herein as a "sensitivity-axis" or "sensing axis" and each sensing axis has a reference direction. For example, for Hall sensor elements, voltage values output by the sensor elements change according to the magnetic field strength aligned in the direction of the sensing axis.

Sensor elements that form a differential pair have a same sensing axis (i.e., they are sensitive to the same magnetic field component) but have their reference directions arranged antiparallel to each other. Thus, one sensor element may be sensitive to a +B magnetic field component and the other may be sensitive to a −B magnetic field component. In this way, homogenous and non-homogenous external stray magnetic fields can be canceled out when the differential sensor signal is generated by a sensor circuit.

The magnetic field sensor elements are configured to measure one or more characteristics of a magnetic field (e.g., an amount of magnetic field flux density, a field strength, a field angle, a field direction, a field orientation, etc.). Specifically, the differential magnetic field sensors described herein are implemented as current sensors that measure a magnetic field produced a current-carrying conductor. Each magnetic field sensor element is configured to generate a sensor signal (e.g., a voltage signal) in response to one or more magnetic fields impinging on the sensor element. Thus, a sensor signal is indicative of (i.e., proportional to) the magnitude of the magnetic field impinging on the sensor element.

For example, the magnetic field sensor can be used as a current sensor if it is coupled to a magnetic field generated by some current to be measured which flows through some primary conductor. For example, contactless current measurement can be accomplished by using the magnetic field sensor to sense the magnetic field caused by a current passing through the primary conductor (further referred to as primary current or test current). The magnetic field caused by the primary current depends on the magnitude of the primary current. For example, for a long straight wire carrying a primary current iP the magnitude of the resulting magnetic field H at a distance d from the wire is directly proportional to the primary current iP. In accordance to the Biot—Savart law, the magnitude of the magnetic field H equals $H = iP/(2\pi d)$ if the wire is very long (theoretically infinitely long) as compared to the distance d.

The current sensor may be implemented such that the differential sensor signal is calculated within the sensor module and the differential measurement signal is generated as an output signal. Further, it will be appreciated that the terms "sensor signal", "measurement signal", and "measurement value" may be used interchangeably throughout this description.

According to one or more embodiments, magnetic field sensor elements and a sensor circuit are both accommodated (i.e., integrated) in the same chip package (e.g., a plastic encapsulated package, such as leaded package or leadless package, or a surface mounted device (SMD)-package) and/or on a same circuit substrate, such as a printed circuit board (PCB). Together, the sensor elements and the sensor circuit may be referred to as a magnetic field sensor, sensor module, or sensor device.

The sensor circuit may be referred to as a signal processing circuit and/or a signal conditioning circuit that receives the sensor signals from the magnetic field sensor elements in the form of raw measurement data and derives, from the sensor signals, a measurement signal (e.g., a differential measurement signal) that represents the magnetic field.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

The sensor circuit may include an analog-to-digital converter (ADC) that converts the analog signals from the sensor elements to digital signals. Alternatively, the sensor circuit may generate the differential measurement signal in the analog domain before converting it into the digital domain. The sensor circuit may also include a digital signal processor (DSP) that performs some processing on the digital signals. Therefore, the sensor comprises a circuit which conditions and amplifies the small signals of the magnetic field sensor elements via signal processing and/or conditioning, and performs additional processing to generate the differential measurement signal.

More particularly, the embodiments are directed to a combination of a power output device that distributes power to a load and a differential magnetic sensor implemented as a current sensor for measuring the load current. Examples of power output devices include power modules, power inverters, power distribution systems, electronic fuses, battery monitoring systems, battery disconnect switches, and the like. For example, a power module may include a single power inverter or n power inverters, hence have one phase or n phases, respectively. The power module may be a high current power module with a signal inverter that includes one current output to drive a load. In an example for implementing n inverters, the power module may be a high current power module that includes three current outputs (i.e., n=3) used to drive each of three phases of an electric motor. For example, the power module may be used for driving a main motor of an electric car. Thus, one or more current sensors may be provided, for example, to measure each current output of the power module.

Embodiments are further directed to a high power device that is coupled to a magnetic sensor by arranging the magnetic sensor within a connector (e.g., within a volume of the connector.

Figure 1A:
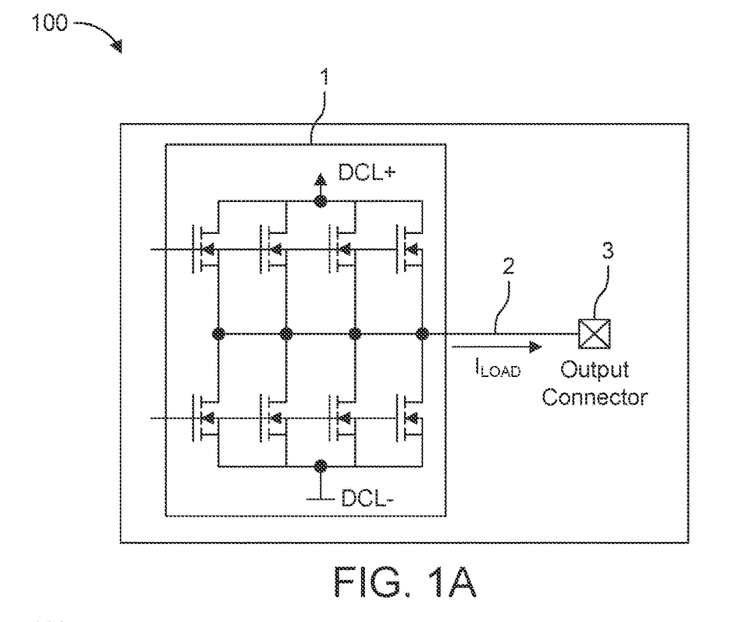
FIGS. 1A and 1B are schematic block diagrams illustrating an output stage of a power output device according to one or more embodiments.
Figure 1B:
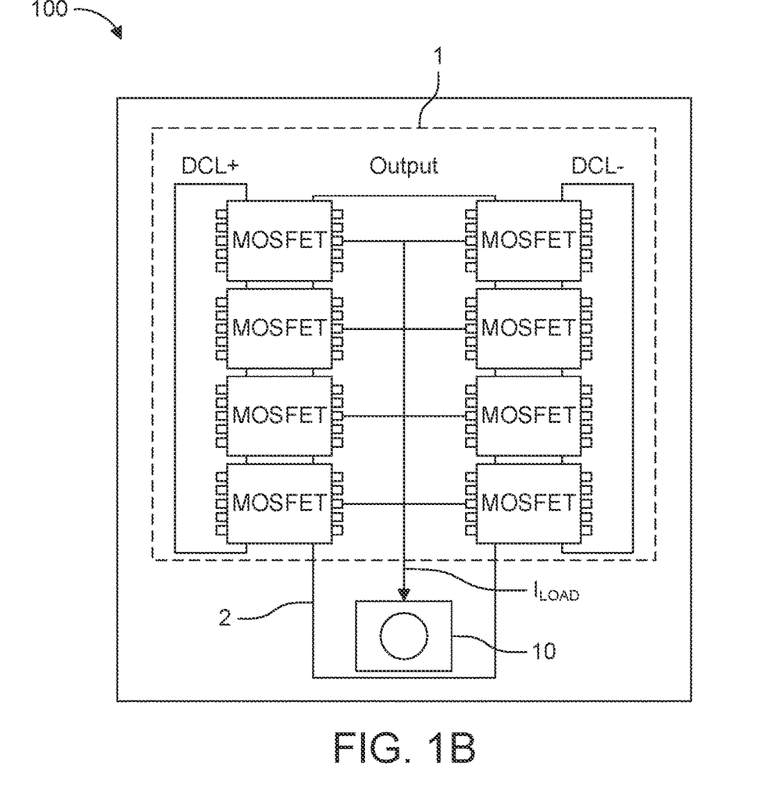

FIGS. 1A and 1B are schematic block diagrams illustrating an output stage 100 of a power output device according to one or more embodiments. In particular, the output stage 100 is and output stage of a power inverter 1 (single phase, n=1). The output stage 100 includes four MOSFETs half-bridge devices in parallel between DC link supply rails (DCL+ and DCL−), but is not limited to any particular number of devices. For high voltage applications beyond 100V, IGBTs or SiC FETs can be used instead of standard MOSFETs. A load current LOAD flows along a primary conductor 2 in the direction of an output node 3 at which an output connector 10 is electrically and mechanically coupled to the primary conductor 2. The primary conductor 2 may be a conductive layer, such as copper, of a power PCB. Furthermore, multiple primary conductors may be present, particularly in a power PCB that comprises multiple power conductive layers that each conduct a portion of the output current.

The output node 3 collects the output current of all power switches of the power inverter 1 and is received by the output connector 10. The output connector 10 is further coupled both mechanically and electrically to a load for delivering power (current) thereto. For example, the output connector 10 may be connected to a motor phase of a motor. Thus, the output connector 10 is configured such that the load current LOAD flows to the output connector 10 from the primary conductor 2 and further flows through the output connector 10 to the load.

The magnetic field caused by the output current is directly proportional to the magnitude of the output current. In particular, the measured magnetic field represents (i.e., is proportional to) a current density of a current flowing through the primary conductor 2. As will be described in further detail, the output connector 10 includes a current sensor (i.e., a differential magnetic sensor) that is configured to measure the total output current ILOAD of the half-bridge stage of the power inverter 1.

It will be appreciated that in some applications, such as multi-phase motor, the output node 3 may also collect a phase current from the load such that the phase current flows towards the output stage 100. Thus, the total current that flows through the output connector 10 may be generally referred to as a test current Itest, which includes currents flowing into and out from a load.

Figure 2:
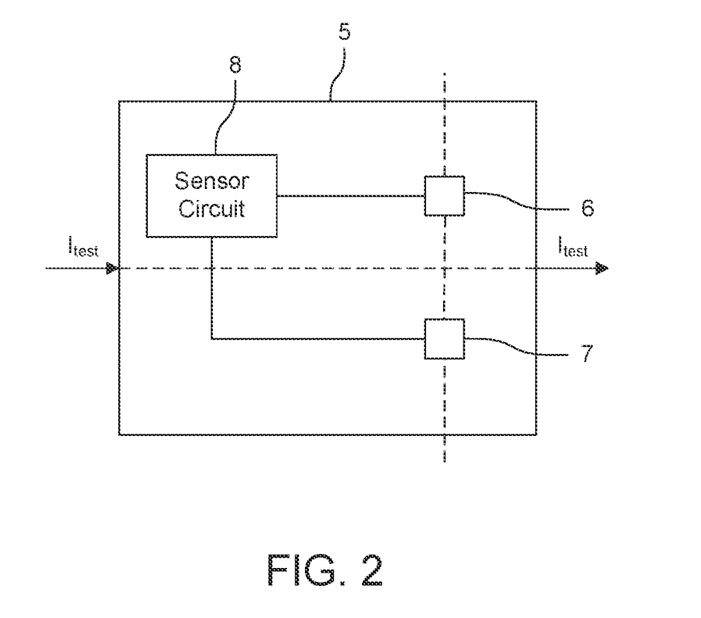
FIG. 2 shows a schematic block diagram of a differential magnetic sensor implemented as a current sensor according to one or more embodiments.
Figure 3A:
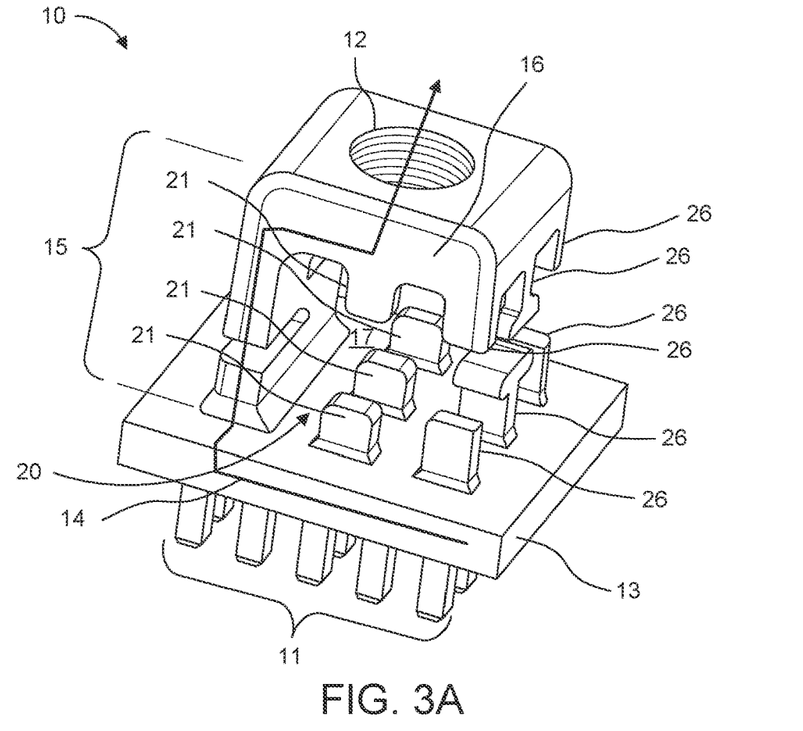
FIGS. 3A-3F show various perspective views of an output connector according to one or more embodiments.
Figure 3B:
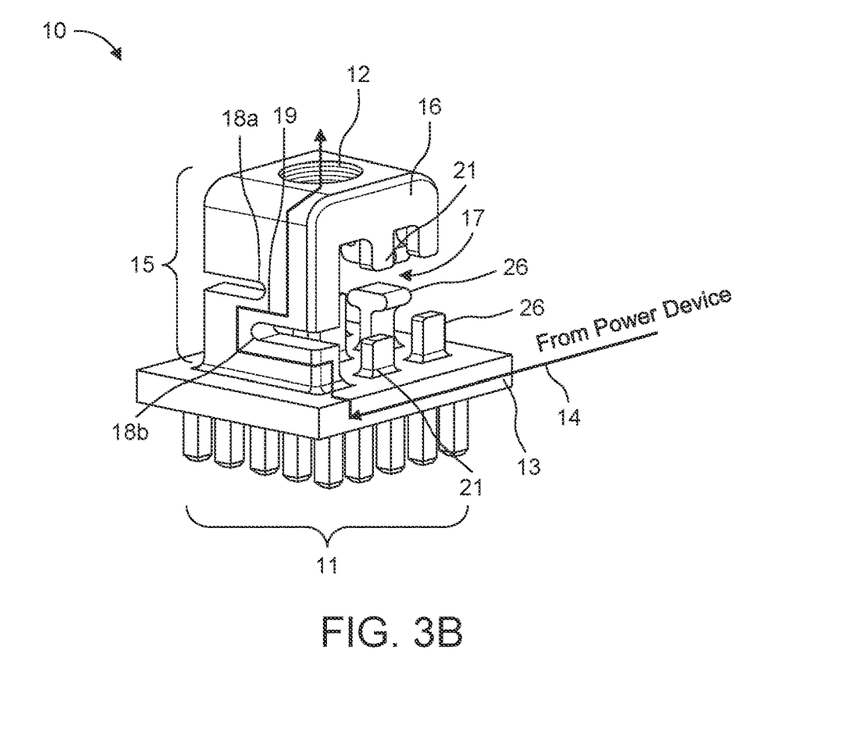
Figure 3C:
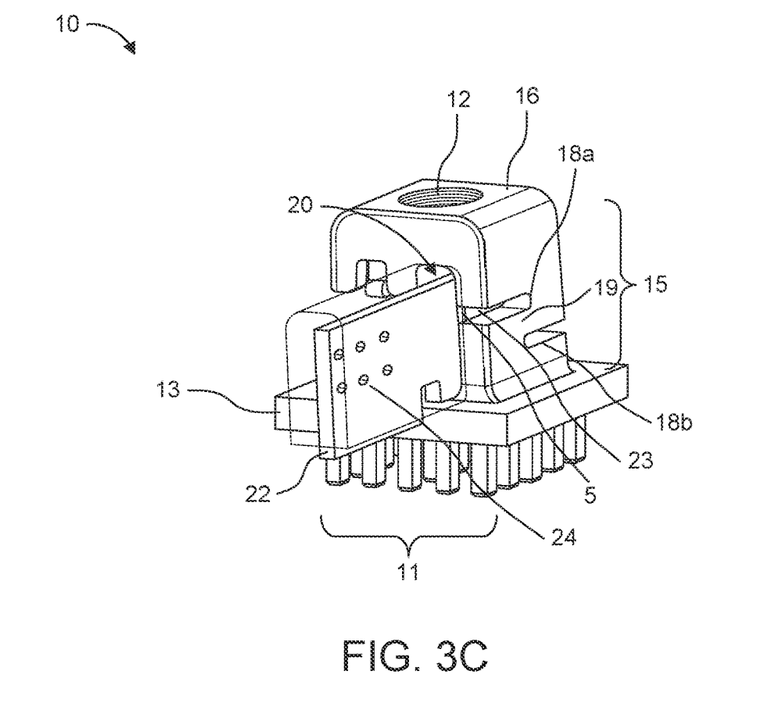
Figure 3D:
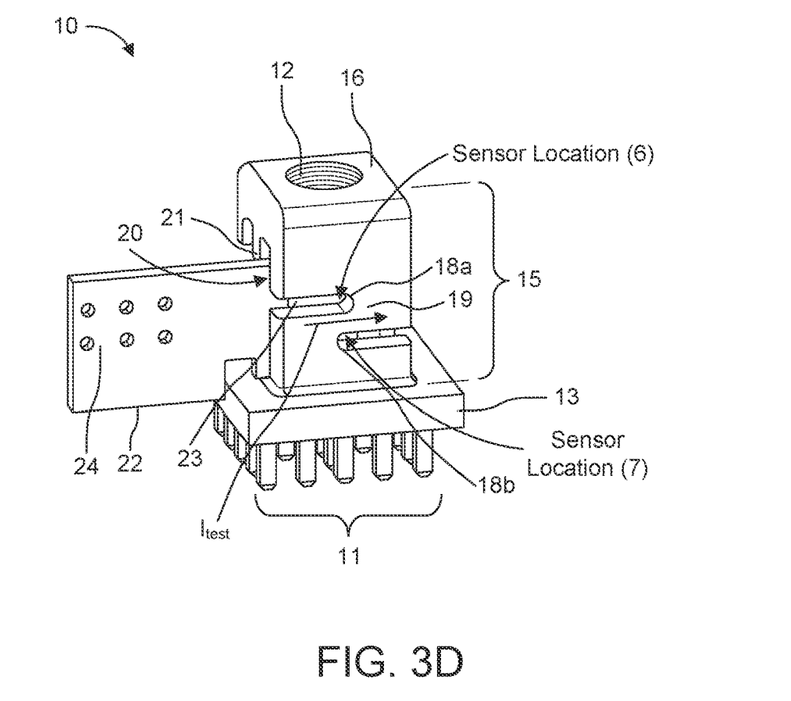
Figure 3E:
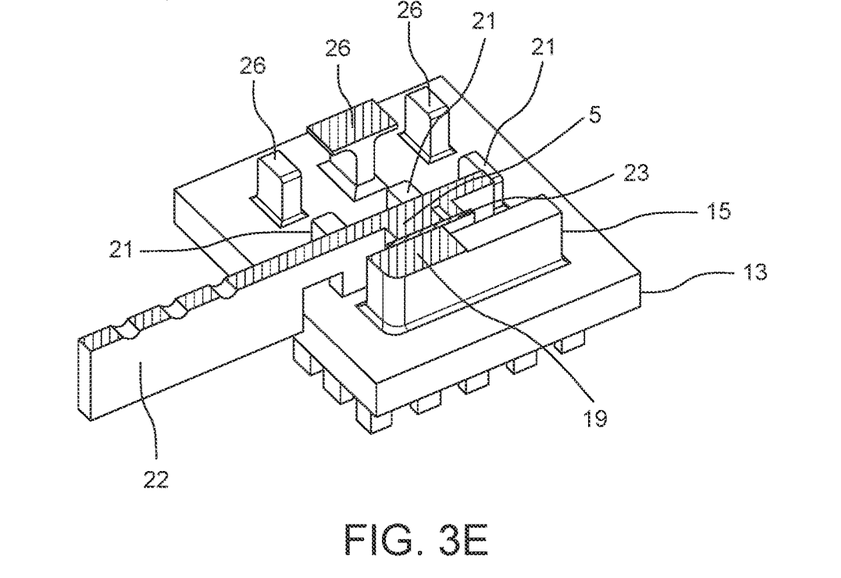
Figure 3F:
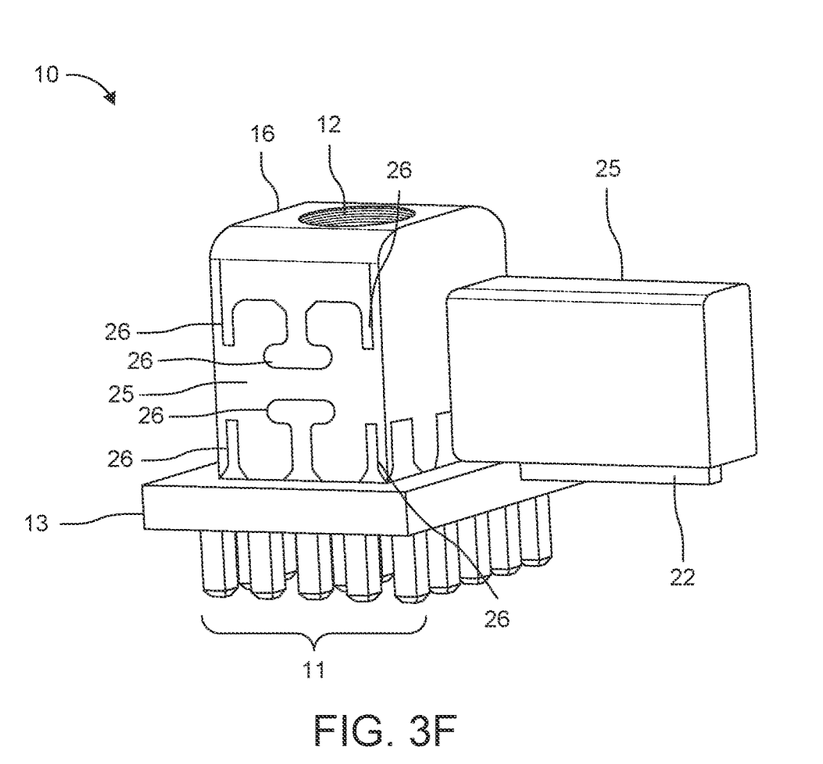

FIG. 2 shows a schematic block diagram of a differential magnetic sensor 5 implemented as a current sensor according to one or more embodiments. The differential magnetic sensor 5 includes a pair a sensor elements 6 and 7 that are configured to sense a magnetic field produced by the test current Itest and a sensor circuit 8 that receives the sensor signals generated by the sensor elements 6 and 7. In particular, the differential magnetic sensor 5 is located proximate to the test current Itest. The sensor elements 6 and 7 are differentially placed at different locations on a sensor die. In this example, the differential sensor element pair are two Hall sensor elements that are differentially spaced in a vertical direction with respect to a current flow direction. That is, the sensor elements 6 and 7 straddle opposite sides of the test current Itest and are aligned with each other in a direction that is orthogonal to the current flow direction.

In some embodiments, the sensor elements 6 and 7 are differentially spaced so that the magnetic field impinges upon both sensing elements 6 and 7 with equal magnitude. However, it will be appreciated that other arrangements are possible so long as the sensing elements are located within the magnetic field or at a location where the magnetic field is expected when a current is applied through the primary conductor 2. Thus, the sensor elements 6 and 7 may be non-symmetrically offset from the centered position in some applications.

Together, the pair a sensor elements 6 and 7 generate an analog differential sensor signal (e.g., a differential Hall voltage). In general, the sensor circuit 8 generates the differential sensor signal from the two sensor signals generated by the sensor elements 6 and 7 using differential calculus. As an example, the sensor elements 6 and 7 may be coupled to combining circuitry or combining logic of the sensor circuit 8 that is configured to generate the differential sensor signal. Thus, the combining circuity of the sensor circuit 8 receives the sensor signals from the sensor elements 6 and 8 and generate the differential sensor signal therefrom. For example, the combining circuitry of may include one or more differential amplifiers that outputs the difference between the sensor elements 6 and 7. A differential sensor signal may provide robustness to homogenous and non-homogenous external stray magnetic fields, and may provide more accurate measurements compared to a monocell sensor configuration. Despite this advantage, the embodiments are not limited to the magnetic sensor being a differential magnetic sensor and can be a monocell magnetic sensor with a single sensor element (e.g., sensor element 6 or 7).

FIGS. 3A-3F show various perspective views of an output connector 10 according to one or more embodiments. The output connector 10 includes interface pins 11 at one end and a threaded thru-hole 12 at the opposite end.

The interface pins 11 protrude from a base plate 13 of the output connector 10 and are configured to be mechanically and electrically coupled to the primary conductor 2. In particular, the primary conductor 2 may include pin holes (not illustrated) located at the output node 3 that extend into a thickness direction of the primary conductor 2. The pin holes are configured to receive the interface pins 11 into which the interface pins 11 are inserted (pressfit). Due to the interface pins 11, the output connector 10 can be configured to provide a massive interface to all power layers on a power PCB for receiving the total output current therefrom. Other interface schemes other than press-fit pins can be used, such as SMD or thru-hole solder connections may be used. In general, all assembly techniques known from standard connectors (SMD, through-hole technology (THT), press-fit, etc.) can be implemented.

The threaded thru-hole 12 is configured to receive a conductive fastener, such as a threaded bolt or screw, that mechanically and electrically couples the output connector 10 to the load. Other types of connecting elements may be used for mechanically and electrically connecting the connector to the load and is not limited to a thru-hole/fastener arrangement. For example, a pin or a clip could also be used. As such, a conductive path 14 is formed between the primary conductor 2 and the load, and, more particularly, between the base plate 13 and the thru-hole 12 through which the test current Itest flows.

The base plate 13 is part of a conductive frame of the output connector 10. The top/bottom main surfaces of the base plate 13 define two planes that are parallel to the current flow direction of the test current Itest. The base plate 13 is designed to collect the test (output) current Itest from the primary conductor 2 (e.g., the power PCB structure). An extension plate 15 of the conductive frame extends orthogonally from one side of the base plate 13 and, consequently, also orthogonally from the primary conductor 2. The test current Itest is routed from the base plate 13, through the extension plate 15, to the fastener that is coupled to the threaded thru-hole 12.

A cap plate 16 of the conductive frame extends laterally outward from the extension plate 15 and hangs over part of the conductive path 14 of the base plate 13. Thus, the cap plate 16 backtracks over the base plate 13 towards an opposite side of the base plate 13 so that a cavity 17 (i.e., a connector volume) is defined by the base plate 13, the extension plate 15, and the cap plate 16. The extension plate 15 extends orthogonal to both the base plate 13 and the cap plate 16 and forms a conductive bridge therebetween.

The cap plate 16 accommodates the thru-hole 12, which extends (lengthwise) in a direction parallel to the extension plate 15. Together, the base plate 13, the extension plate 15, and the cap plate 16 form the conductive frame as a one-piece integral construction. The interface pins 11 are also part of that one-piece integral construction. The base plate 13, the extension plate 15, and the cap plate 16 may form a C-shape or a hollowed rectangular prism.

The extension plate 15 has a constriction region having zig-zig shape (e.g., a Z-shape or an S-shape) comprising an inverted S-bend or an S-bend depending on which sides the cut-outs 18a and 18b are made. Here, an inverted S-bend is shown. However, the cut-outs 18a and 18b could be inverted to make an S-bend. For the purpose of this disclosure, the term "S-bend" refers to both inverted and non-inverted orientations.

The cut-outs 18a and 18b are differentially displaced from each other along the vertical trajectory of the conductive path 14 (i.e., along the lengthwise dimension of the extension plate 15 that extends from the base plate 13 to the cap plate 16). Additionally, the cut-outs 18a and 18b extend inwardly from opposite lateral sides of the extension plate 15, thereby forming the inverted S-bend or an S-bend. Furthermore, the cut-outs 18a and 18b partially overlap in the lengthwise dimension of the extension plate 15. In other words, their most inward ends overlap in the vertical direction.

At the center region of the inverted S-bend or an S-bend, the extension plate 15 further includes a current constriction structure 19 (i.e., a current constriction region). The current constriction structure 19 is a middle segment of the inverted S-bend or the S-bend that connects the bottom segment (base segment) of the S-bend that is directly coupled to the base plate 13 to the top segment (cap segment) of the S-bend that is directly coupled to the cap plate 16. The current constriction structure 19 is a narrowed, constricted structure that extends horizontally across the extension plate 15 (i.e., along a widthwise dimension of the extension plate 15 from one lateral side to the other, opposite lateral side). For example, the middle segment of the S-bend is a lateral, constricting segment.

As a result of the zig-zag conductive pathway (S-shape or inverted S-shape), the test current Itest is forced to wind through the constriction region of the extension plate 15. In particular, the inverted S-bend or an S-bend shape of the extension plate 15 concentrates all of the test current Itest through the narrowed current constriction structure 19, thereby increasing the current density of the test current Itest at that passageway and increasing the magnetic flux density produced therefrom. This stronger magnetic field facilitates its detection by the sensor elements 6 and 7 and allows for more accurate measurements to be taken.

In the alternative to the current constriction structure 19 being an S-bend structure, the current constriction structure 19 may have other shapes or configurations. For example, the current constriction structure 19 may diagonally extend from the base plate 13 to the cap plate 16. Alternatively, the current constriction structure 19 may vertically extend from the base plate 13 to the cap plate 16 in an I-shape or I-configuration. Alternatively, the current constriction structure 19 may be C-shaped. In each case, the current constriction structure 19 is includes a constriction segment that is configured to cause a defined magnetic field of the output current flowing through the current constriction structure 19 (i.e., through the constriction segment) at a position of a magnetic current sensor 5 and more particularly at a position of the one or more sensor elements 6 and/or 7. In the case that the magnetic current sensor 5 is a differential sensor, the differential pair of sensor elements 6 and 7 are differentially arranged with respect to the constriction segment of the current constriction structure 19. The sensor elements 6 and 7 of the differential sensor may be aligned with each other in a direction that is orthogonal to a current flow of the output current flowing through the constriction segment.

While several current constriction structures are possible to be implemented into the connector design (e.g., straight, lateral, C-shaped, I-shaped, vertical, diagonal) as an alternative to the S-bend shape, implementing a lateral current constriction structure with horizontal current flow as shown is beneficial to maintain mechanical strength of the connector 10 against applied torque by the connector screw. Maintaining a horizontal section for the residual current path 14 provides the required mechanical strength against deformation due to the application of external torque.

The test current Itest is then conducted via the current constriction structure 19, which creates a differential magnetic field to be sensed by the differential magnetic sensor 5. In particular, because the cut-outs 18a and 18b straddle opposite sides of the current constriction structure 19, they also straddle opposite sides of the test current Itest flowing through the current constriction structure. Furthermore, because the cut-outs 18a and 18b partially overlap in the lengthwise dimension of the extension plate 15, the overlapping portions provide a good location for arranging the sensor elements 6 and 7 in a differential configuration.

The cavity 17 includes a slot 20 defined by anchor structures 21 that protrude upward from the base plate 13 and downward from the cap plate 16. The anchor structures 21 are part of the conductive frame. The slot 20 is configured to receive the sensor 5 and the anchor structures 21 assist in supporting the sensor 5 within the slot 20. The sensor 5 may be coupled to a circuit substrate 22 (e.g., PCB) that is inserted into the slot 20 with the sensor elements 6 and 7 facing the current constriction structure 19. In particular, sensor element 6 may be aligned with cut-out 18a and sensor element 7 may be aligned with cut-out 18b such that the sensor elements 6 and 7 are differentially spaced in a vertical direction with respect to a current flow direction of Itest flowing horizontally through the current constriction structure 19. As a result, both sensor elements 6 and 7 are proximate to the current constriction structure 19 and to the test current Itest.

In addition, an optional isolation layer 23 may be provided between the sensor 5 and the current constriction structure 19. In the implementation shown, the differential magnetic sensor 5 is placed on a circuit substrate 22, which connects the sensor output to a sensor output connector (not illustrated) that is providing the current sensor information. The sensor output connector is connected to an interface region 24 that includes interface structures, such as pin holes, for coupling the sensor output connector to the circuit substrate 22.

The current sensing implementation requires a concentration of the current into a relatively narrow cross section (current constriction structure 19) that is defined by the cut-outs 18a and 18b. In order to ensure the mechanical integrity of the output connector 10, the interior volume (cavity 17) of the output connector 10 is at least partially filled with potting/mold material 25 (i.e., filler material). For example, the filler material 25 may extend from the base structure 13 to the cap structure 16 to provide mechanical stability. Additionally, or alternatively, the filler material 25 may be interposed between the magnetic current sensor 5 and extension structure 15 to fix the position of the magnetic current sensor 5 relative to extension structure 15 and to insulate the magnetic current sensor 5 from the extension structure 15.

Additional anchor structures 26 provide to ensure a strong connection between the filler material 25 and the residual conductive material of the output connector 10. Specifically, the additional anchor structures 26 protrude upward from the base plate 13 and downward from the cap plate 16. The additional anchor structures 26 are part of the conductive frame. Some of the additional anchor structures 26 may include a T-shape, an L-shape, an E-shape, an F-shape, an I-shape, or the like that hooks around the filler material 25, thereby provides further structural coupling to the filler material 25 and enhancing the structural integrity of the output connector 10. The anchor structures 21 also provide mechanical coupling to the filler material 25. Some of the anchor structures 21 may also have a T-shape, an L-shape, an E-shape, an F-shape, an I-shape for better coupling to the filler material 25.

The filler material 25 may also fill the cut-outs 18a and 18b. The filler material 25 may also be disposed over the circuit substrate 22. The filler material 25 also ensures isolation of the low voltage domain (i.e., the sensor output) vs. the power domain. Thermal properties of the output connector 10 such as thermal mass and heat conductivity between the PCB connection of the primary conductor 2 and the output terminal 3 can be optimized by maximizing the metal content of the output connector 10, minimizing the gap distance between the base plate 13 and the cap plate 16, especially by applying anchor structures 21 and 26 as shown, and using highly non-conductive potting/mold material for the filler material 25. The filler material 25 has insulating properties to insulate the magnetic sensor 5.

While the aforementioned embodiments are directed to the magnetic sensor 5 being arranged within the connector volume, the magnetic sensor 5 may be arranged outside the connector volume while still being able to measure the magnetic field produced by the current flowing through the current constriction structure 19 of the connector 10. For example, the magnetic current sensor may be attached to a structure within the connector volume but may be located outside the connector volume. Alternatively, the magnetic sensor 5 may be attached to an exterior surface of the extension plate 15 outside of the connector volume with possibly the isolation layer 23 provided between the magnetic sensor 5 and the current constriction structure 19. Alternatively, the magnetic sensor 5 may protrude beyond the connector volume, thereby being located partially inside and partially outside the connector volume. Differential sensing using two senor elements can still be implemented in these alternative arrangements in accordance with the above description.

Figure 4:
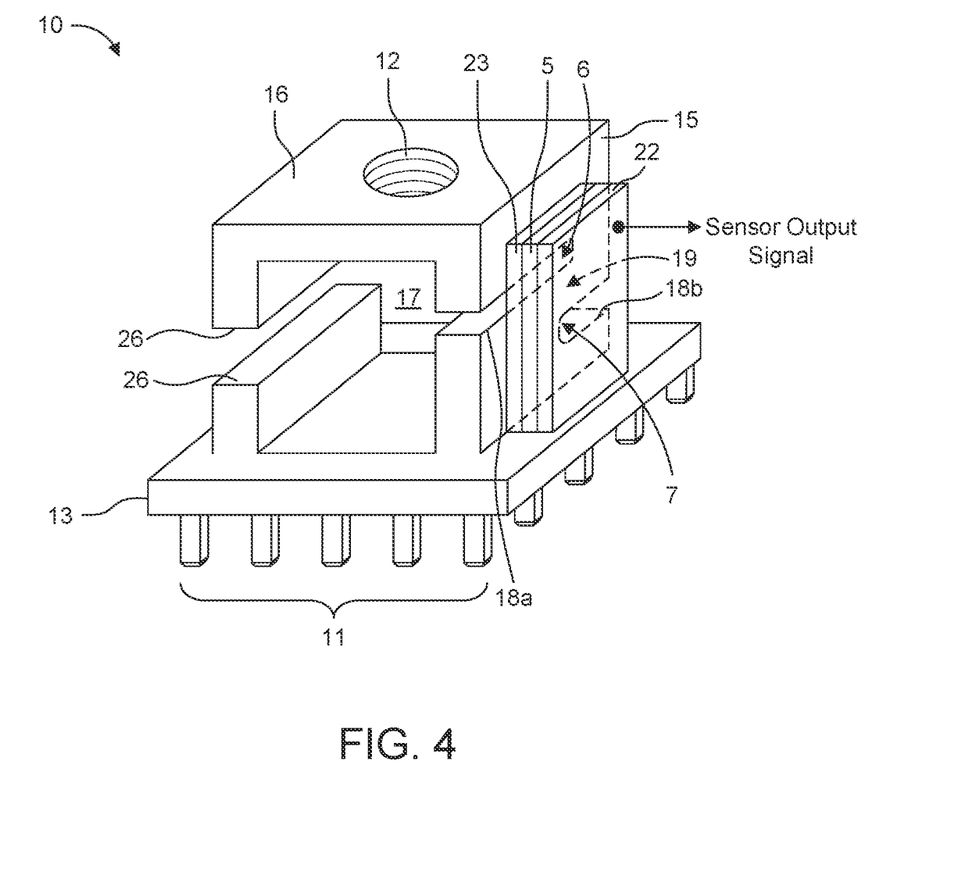
FIG. 4 shows a perspective views of the output connector having a magnetic sensor attached outside of the connector volume according to one or more embodiments.

FIG. 4 shows a perspective views of the output connector 10 having a magnetic sensor attached outside of the connector volume according to one or more embodiments. Here, the output connector 10 has a "C" shape that defines the volume 17 that can be filled at least partially with filling material. The magnetic sensor 5 is attached to an exterior surface of the extension plate 15 outside of the connector volume with the isolation layer 23 provided between the magnetic sensor 5 and the current constriction structure 19. The circuit substrate 22 is attached to the other side of the magnetic sensor 5 and is configured to provide a sensor output signal (e.g., a differential sensor signal) device from the measurements takes by sensor elements 6 and 7. The sensor elements 6 and 7 are integrated at the magnetic sensor 5 and are aligned with cut-outs 18a and 18b, respectively.

In view of the above, the output connector 10 with the integrated magnetic sensor 5 arranged at least partially, if not fully, within the volume of the connector 10 provides several benefits, including: reduced solution size, the selection of the applied power board technology is independent from requirements for the current sensor, power routing without restrictions for the current sensor, reduced number of high power components to be populated, a pre-calibrated sensor may be used with no additional calibration steps required by end manufacturer, and a significant reduction of overall cost.

It will be further appreciated that the connector 10 could also be used as a supply connector in which case the connector is both mechanically and electrically coupled to a power supply or current supply device. For this reason, the connector 10 may simply be referred to as a power connector that can be used for power output devices or power supply devices.

Figure 5:
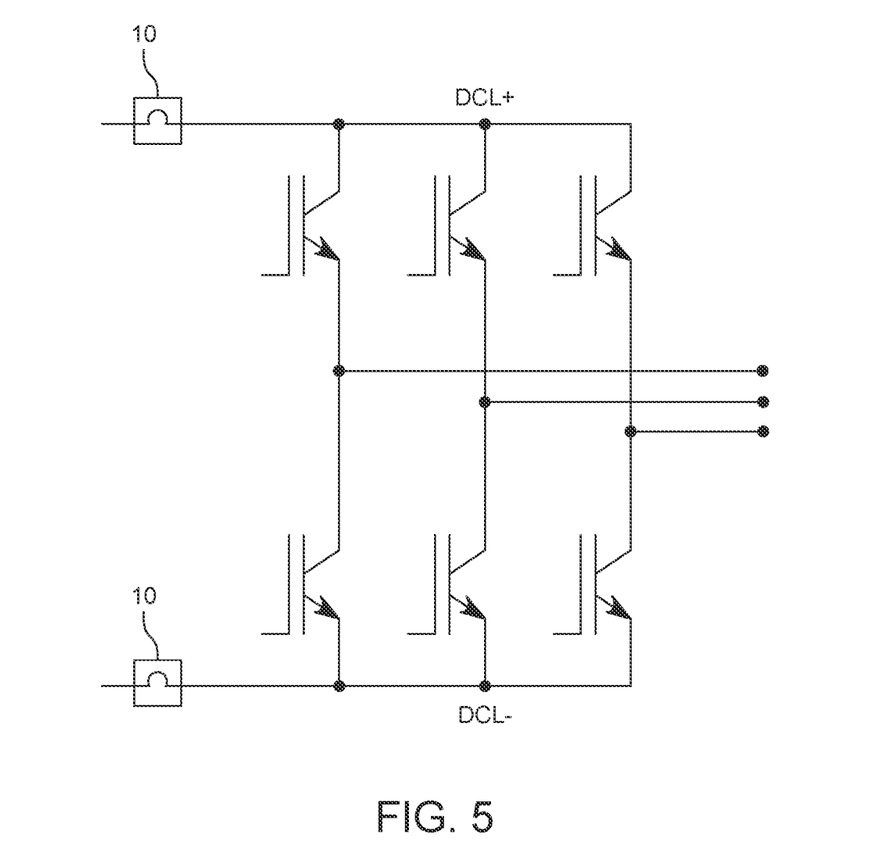
FIG. 5 is a schematic block diagram illustrating supply lines to an inverter stage according to one or more embodiments.

FIG. 5 is a schematic block diagram illustrating supply lines to an inverter stage according to one or more embodiments. The supply lines may be DC link supply rails (DCL+ and DCL−). Connectors 10 can be provided at one or both supply lines that are connected to the inverter stage.

As a supply connector, the magnetic sensor 5 is used to measure and monitor a supply current generated by the power supply or current supply device, such as a battery. The supply connector would be structurally the same as the output connector. Thus, power supply may be regarded as a power supply device, the output current may be regarded as a supply current, and the device that receives the load current may be regarded as a load.

The supply connector may be configured to conduct a supply current of a power supply and deliver the supply current to a device, and includes a conductive frame and a magnetic current sensor. The conductive frame comprises a base structure, an extension structure, and a cap structure that define a connector volume. The base structure is coupled to a supply node of at least one primary conductor of the power supply, wherein the base structure is configured to receive the supply current from the at least one primary conductor. The cap structure is arranged relative to the base structure, wherein the cap structure is configured to mechanically couple the output connector to the device, and wherein the cap structure is configured to receive the supply current from the base structure and output the supply current from the output connector to the device. The extension structure is coupled to and extends between the base structure and the cap structure, wherein the extension structure receives the supply current from the base structure and delivers the supply current to the cap structure. The extension structure includes a current constriction region that is configured to cause a defined magnetic field of the supply current flowing through the current constriction region at a position of a magnetic current sensor.

The magnetic current sensor may be arranged within the connector volume, wherein the magnetic current sensor is configured to generate a sensor signal based on the defined magnetic field produced by the supply current flowing through the current constriction region.

In the alternative, the base structure may be coupled to the device and the cap structure may be coupled to the supply node of the at least one primary conductor of the power supply.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A connector configured to conduct a current, the connector comprising:
   a conductive frame comprising a base structure, an extension structure, and a cap structure that define a connector cavity and further define a current path for the current,
   wherein the base structure is configured to be coupled to a current supply for receiving the current therefrom,
   wherein the cap structure is arranged relative to the base structure, wherein the cap structure is configured to be coupled to an electrical interface of a device to be supplied with the current, and wherein the cap structure is configured to receive the current from the base structure and output the current from the connector to the electrical interface of the device,
   wherein the extension structure is coupled to and vertically extends between the base structure and the cap structure, wherein the extension structure is configured to receive the current from the base structure and deliver the current to the cap structure,
   wherein the base structure and the cap structure laterally extend from the extension structure such that the cap structure extends over the base structure such that the connector cavity is at least partially defined by a space extending vertically between the cap structure and the base structure, and
   wherein the extension structure includes a current constriction region that is configured to cause a defined magnetic field of the current flowing through the current constriction region at a predefined position.

2. The connector of claim 1, further comprising:
   a magnetic current sensor arranged at the predefined position, wherein the magnetic current sensor is configured to generate a sensor signal based on the defined magnetic field produced by the current flowing through the current constriction region.

3. The connector of claim 2, wherein:
   the magnetic current sensor is arranged outside the connector cavity,
   wherein the magnetic current sensor is attached to the extension structure, outside the connector cavity, or the magnetic current sensor protrudes beyond the connector cavity.

4. The connector of claim 2, wherein the magnetic current sensor is arranged within the connector cavity.

5. The connector of claim 4, further comprising:
   a filler material that fills at least a portion of the connector cavity, wherein the filler material at least partially encapsulates the magnetic current sensor and is configured to secure the magnetic current sensor within the connector cavity.

6. The connector of claim 2, wherein the magnetic current sensor comprises:
   a differential pair of sensor elements that are differentially arranged with respect to the current constriction region, and
   a sensor circuit configured to generate a differential sensor signal as the sensor signal based on the defined magnetic field produced by the current flowing through the current constriction region.

7. The connector of claim 2, wherein the current constriction region is an S-bend structure through which the current flows, wherein the S-bend structure comprises a constriction segment that is configured to increase a current density of the current that flows through the S-bend structure to cause the defined magnetic field at the predefined position at which the magnetic current sensor is arranged.

8. The connector of claim 7, wherein the constriction segment is a middle segment of the S-bend structure that connects a base segment of the S-bend structure to a top segment of the S-bend structure, wherein the base segment is coupled to the base structure and the top segment is coupled to the cap structure.

9. The connector of claim 2, further comprising:
   an isolation layer disposed between the magnetic current sensor and the current constriction region.

10. The connector of claim 1, further comprising:
    a filler material that fills at least a portion of the connector cavity.

11. The connector of claim 10, wherein the filler material is a non-conductive material having an insulating property.

12. The connector of claim 10, further comprising:
    a magnetic current sensor arranged at the predefined position, wherein the magnetic current sensor is configured to generate a sensor signal based on the defined magnetic field produced by the current flowing through the current constriction region, wherein the filler material is interposed between the magnetic current sensor and extension structure to fix the position of the magnetic current sensor relative to extension structure and to insulate the magnetic current sensor from the extension structure.

13. The connector of claim 1, wherein the cap structure comprises a bore-hole that vertically extends into the cap structure towards the base structure, wherein the bore-hole is configured to receive a fastener for coupling the connector to the electrical interface of the device.

14. The connector of claim 1, further comprising:
a first plurality of anchor structures that extend partially from the base structure toward the cap structure within the connector cavity;
a second plurality of anchor structures that extend partially from the cap structure toward the base structure within the connector cavity; and
a filler material that fills at least a portion of the connector cavity and is mechanically engaged with the first plurality of anchor structures and the second plurality of anchor structures.

15. The connector of claim 1, wherein the conductive frame is a one-piece integral member formed by the base structure, the extension structure, and the cap structure.

16. A connector configured to conduct a current, the connector comprising:
a conductive frame comprising a base structure, an extension structure, and a cap structure that define a current path for the current,
wherein the base structure is configured to be coupled to a current supply for receiving the current therefrom,
wherein the cap structure is arranged relative to the base structure, wherein the cap structure is configured to be coupled to an electrical interface of a device to be supplied with the current, and wherein the cap structure is configured to receive the current from the base structure and output the current from the connector to the electrical interface of the device,
wherein the extension structure is coupled to and vertically extends between the base structure and the cap structure in an extension direction, wherein the extension structure is configured to receive the current from the base structure and deliver the current to the cap structure,
wherein the base structure laterally extends from the extension structure,
wherein the cap structure is arranged vertically over the base structure with the extension structure arranged vertically therebetween,
wherein the extension structure includes a current constriction region coupled between two current non-constriction regions of the conductive frame, wherein the current constriction region is configured to increase a magnetic flux density of a magnetic field produced by the current flowing through the current constriction region relative to magnetic flux densities of a magnetic field produced by the current flowing through the two current non-constriction regions; and
a magnetic current sensor arranged at a position relative to the current constriction region to receive the magnetic field having the increased magnetic flux density produced by the current flowing through the current constriction region, wherein the magnetic current sensor is configured to generate a sensor signal based on the received magnetic field.

17. The connector of claim 16, wherein the connector is a supply connector, the current supply is a power supply, and the device is a power inverter.

18. The connector of claim 17, wherein the connector is configured to be arranged on a supply line between the power supply and an inverter stage of the power inverter.

19. The connector of claim 16, wherein the extension structure includes the two current non-constriction regions, wherein a first current non-constriction region of the two current non-constriction regions is coupled to the base structure and a second current non-constriction region of the two current non-constriction regions is coupled to the cap structure.

20. The connector of claim 16, wherein the cap structure comprises a bore-hole that extends into the cap structure towards the base structure, wherein the bore-hole is configured to receive a fastener for coupling the connector to the electrical interface of the device.

* * * * *